United States Patent [19]

Luich

[11] Patent Number: 4,727,269
[45] Date of Patent: Feb. 23, 1988

[54] TEMPERATURE COMPENSATED SENSE AMPLIFIER

[75] Inventor: Thomas M. Luich, Federal Way, Wash.

[73] Assignee: Fairchild Camera & Instrument Corporation, Mountain View, Calif.

[21] Appl. No.: 766,865

[22] Filed: Aug. 15, 1985

[51] Int. Cl.[4] .................... G01R 19/00; G06G 7/10; G05F 3/16
[52] U.S. Cl. .................... 307/530; 307/491; 307/547; 307/553; 307/310; 323/316
[58] Field of Search ............ 307/491, 443, 310, 297, 307/546, 547, 553, 562, 296 R, 530; 323/315, 316, 907

[56] References Cited

U.S. PATENT DOCUMENTS

| | | | |
|---|---|---|---|
| 4,198,581 | 4/1980 | Ahmed | 307/296 R |
| 4,215,282 | 7/1980 | Brown et al. | 307/310 |

Primary Examiner—John S. Heyman
Assistant Examiner—M. R. Wambach
Attorney, Agent, or Firm—Stephen J. Phillips; Lee Patch; Paul C. Haughey

[57] ABSTRACT

A temperature compensated sense amplifier is connected to the sense node of a memory array which is OR tied to the bit lines of the array. A PNP current mirror supplies voltage independent controlled current to the sense node. A level shifting stage is connected to the sense node to establish a threshold sensing level, and to switch on to steer the current into the amplifier stage. A compensation stage is connected to the level shifting stage and the amplifier stage to compensate for the $\beta$ factors of the transistors and the resistive changes with temperature. A temperature compensated current sink is connected to the PNP current mirror to track over temperature in opposition therewith and maintain a constant current into the sense node. The level shifting stage and the amplifier stage also include temperature compensating features to provide a sensing threshold which tracks constantly over the operating temperature range.

20 Claims, 4 Drawing Figures

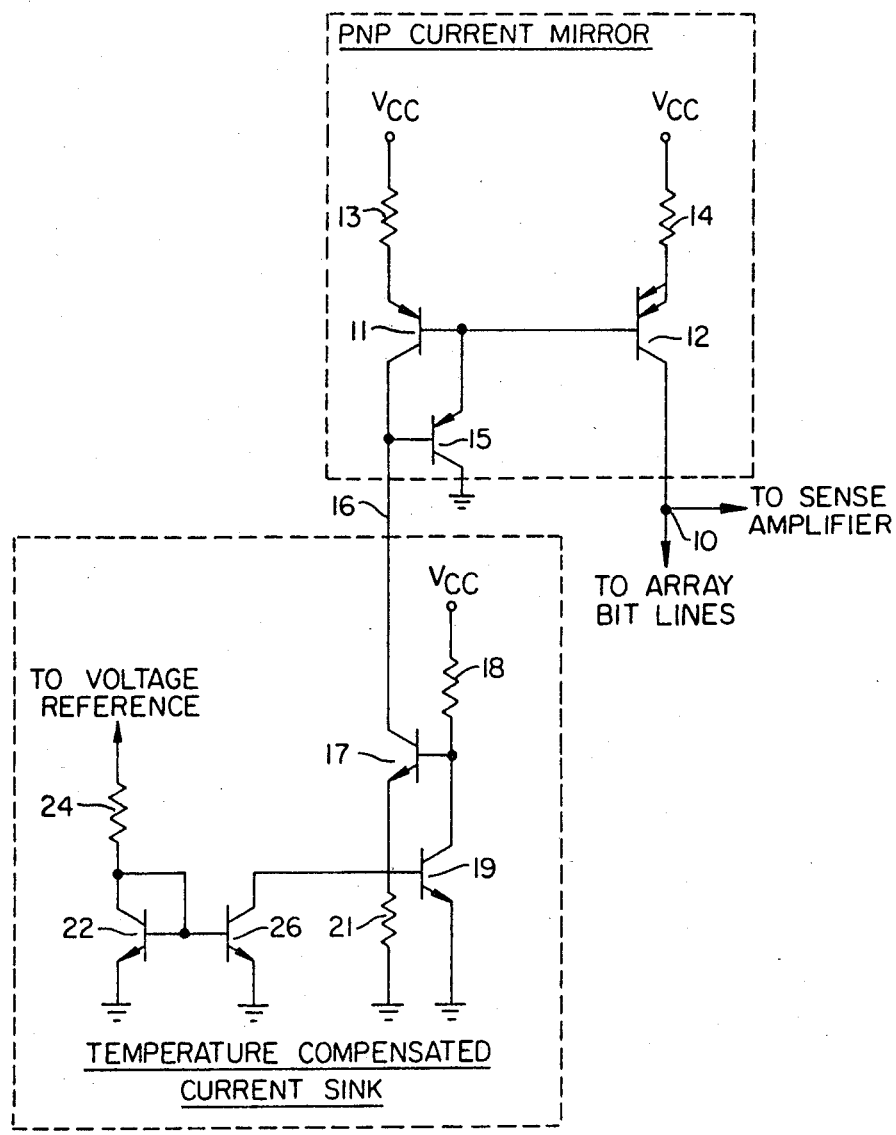
FIG._1.

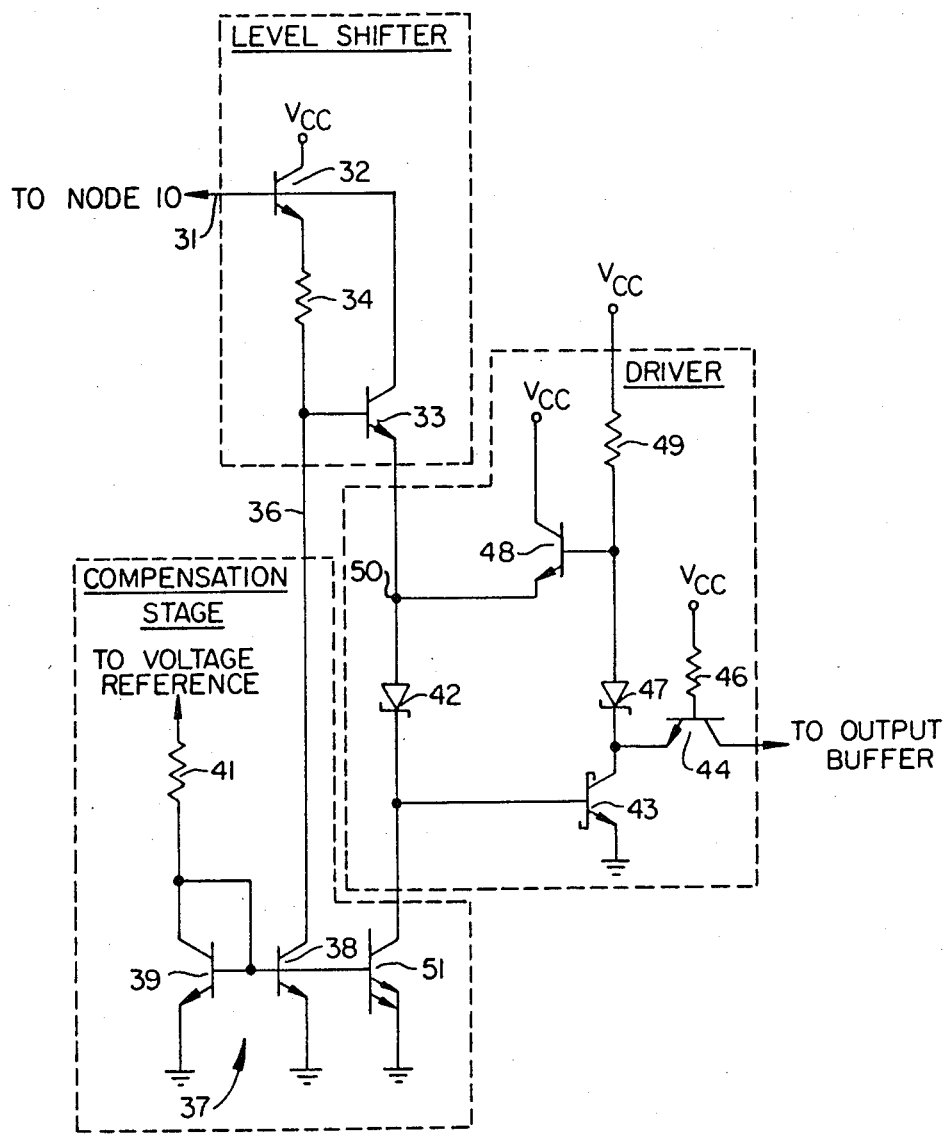
FIG._2.

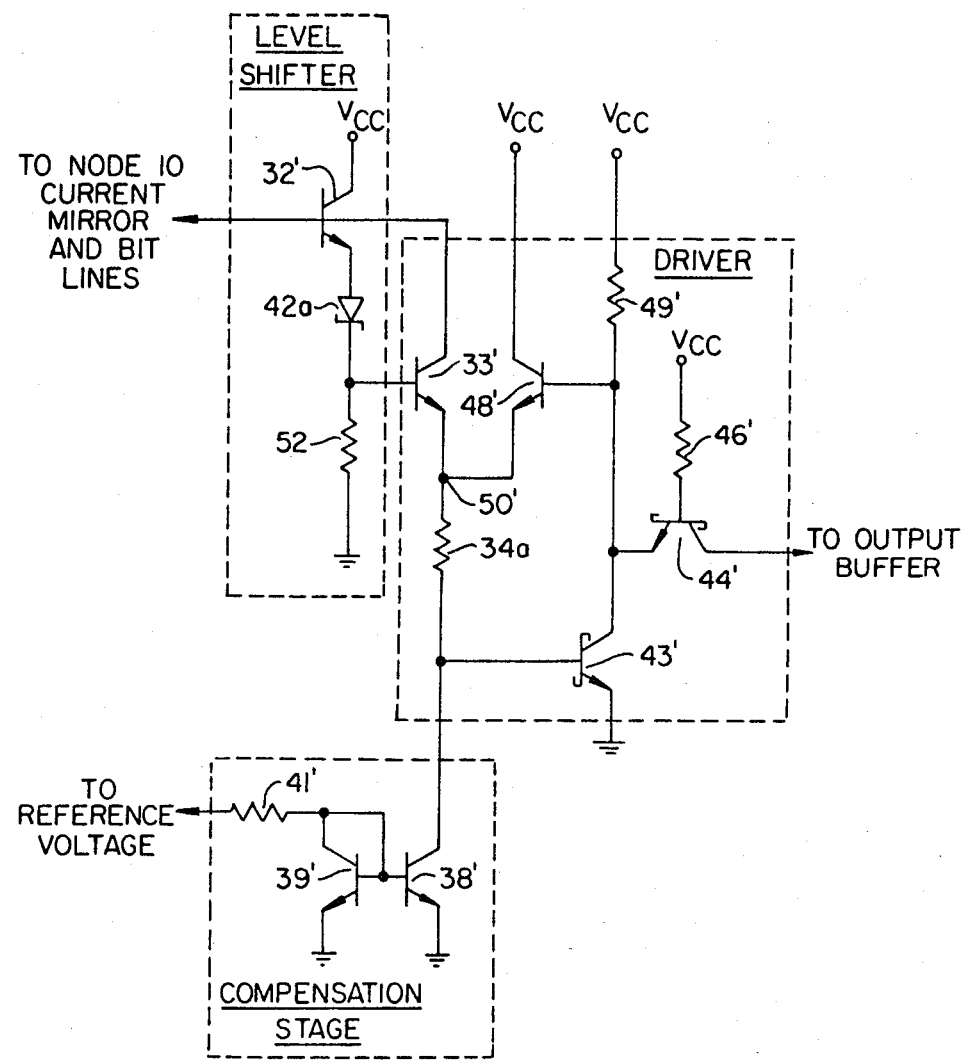
FIG._3.

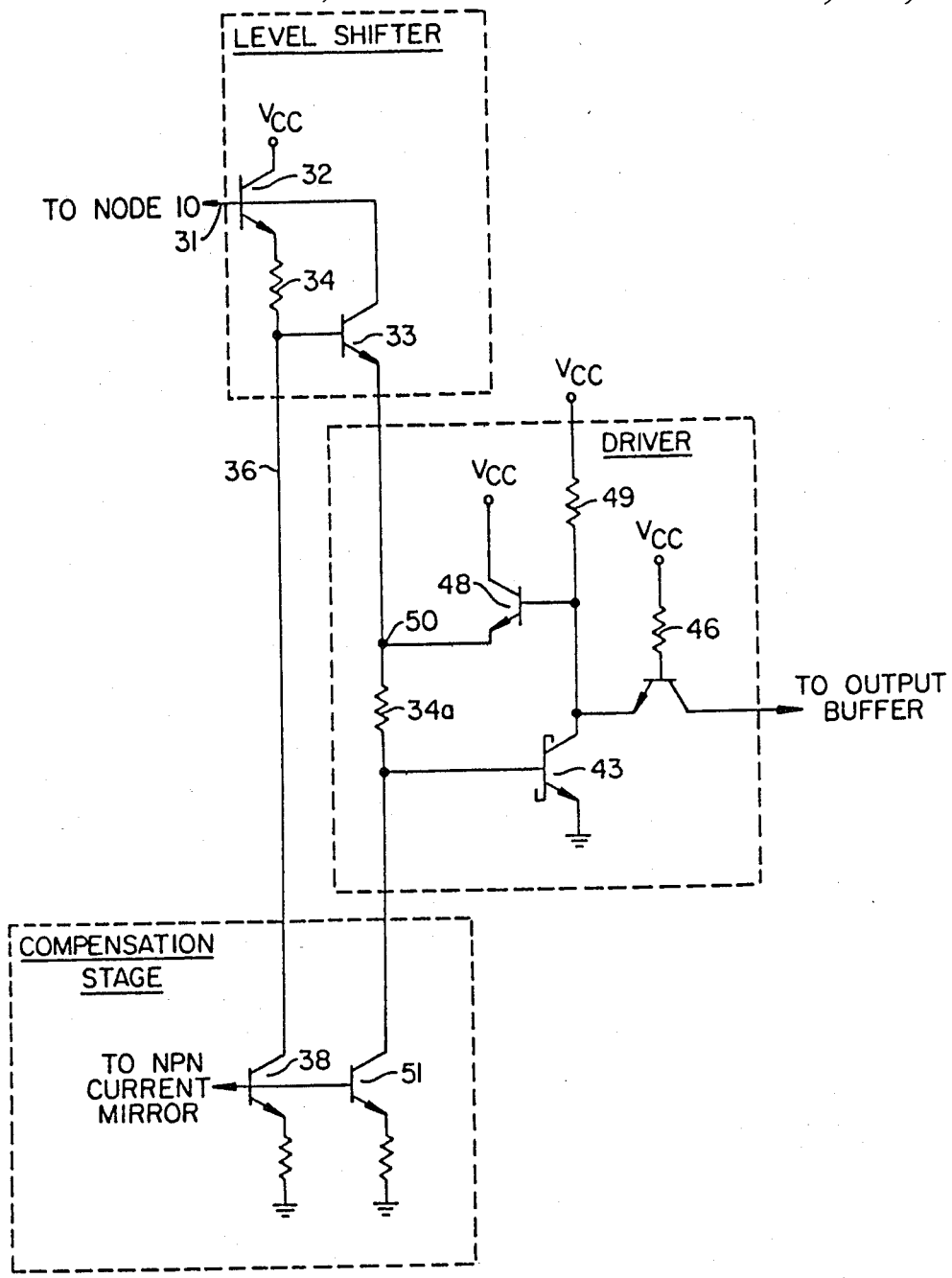
FIG._4.

TEMPERATURE COMPENSATED SENSE AMPLIFIER

BACKGROUND OF THE INVENTION

1. Field of the Invention

This invention relates to sense amplifiers, and in particular to temperature compensated sense amplifiers employes in programmable read-only memories.

2. Description of the Prior Art

In a device such as a programmable read only memory (PROM), it is necessary to provide an amplifier stage, or sense amplifier, to detect voltage changes indicative of shifts in logic levels. The threshold level of the sense amplifier is set between the high and low logic levels, and the voltage difference between the threshold and low levels defines the noise margin. To maximize the operating speed of the device, it is desirable to reduce the noise margin as much as possible, so that the signal rise time from low level to threshold level is minimized. Unfortunately, the noise margin tends to change with temperature, because the low level and the threshold level have differing tracking rates with respect to temperature.

Generally speaking, the threshold level will tend to converge on the low logic level at high temperatures, and will diverge from the low logic level at low temperatures. As a result of these characteristics, the device will have a slower operating speed at lower temperatures. Due to the convergence at high temperatures, the noise margin must be made sufficiently large at high temperature to ensure operation of the device. Ideally, the threshold level and the low logic level should track over temperature at the same rate, providing a constant noise margin and a constant operating speed.

U.S. Pat. No. 4,215,282 discloses a PROM. In this device, controlled current sources are used to compensate for threshold shifts. A current mirror with the same type of current sink is connected to the sense amplifier. This scheme requires a column clamp, or a bit line clamp connected to the sense node. It compensates only for threshold variations, while other temperature effects such as gain changes in the transistors and parasitic capacitance changes are not compensated.

SUMMARY OF THE INVENTION

The present invention generally comprises a sense amplifier for PROM devices or other array devices which provides excellent temperature compensation over the operating temperature range of the device. A salient aspect of the invention is that multiple temperature compensating components are used, so that temperature-caused changes in resistor values, $\beta$ gain values, and parasitic capacitance effects are effectively neutralized. As a result, the sense amplifier of the present invention provides a virtually constant noise margin over temperature, and a faster operating speed for the PROM device.

The temperature compensated sense amplifier is connected to the sense node of the memory array which is OR tied to the bit lines of the array. A PNP current mirror supplies voltage-independent controlled current to the sense node. A temperature compensated sink is connected to the PNP current mirror to track over temperature in opposition therewith and maintain a constant current into the sense node. A level shifting stage is connected to the sense node to establish a threshold sensing level, and to switch on to steer the current into the amplifier stage. A compensation stage is connected to the level shifting stage and the amplifier stage to compensate both for the $\beta$ factors of the transistors and the resistive changes over temperature. The level shifting stage and the amplifier stage also include temperature compensating features to provide a sensing threshold which tracks constantly over the operating temperature range of the device.

BRIEF DESCRIPTION OF THE DRAWINGS

FIG. 1 is a schematic diagram of the controlled current mirror and the temperature compensated current sink connected to the sense amplifier of the present invention;

FIG. 2 is a schematic diagram of one embodiment of the temperature compensated sense amplifier of the present invention;

FIG. 3 is a schematic diagram of an alternative embodiment of the sense amplifier of the present invention; and FIG. 4 is a schematic diagram of the preferred embodiment of the sense amplifier of the present invention.

DETAILED DESCRIPTION OF THE PREFERRED EMBODIMENT

The present invention generally comprises a temperature compensated sense amplifier for detecting rapid voltage changes indicative of shifts in logic level. Although the device is described in conjunction with a PROM array, it should be appreciated that the invention may be used to sense logic level changes at the sense node of other integrated circuit devices.

As shown in FIG. 1, the invention includes a sense node 10 which is connected through an OR tie to the bit lines of the PROM memory array, as is known in the prior art. A PNP current mirror network is connected to the sense node 10 to provide a controlled current flow through the node to either the bit lines or to the sense amplifier. The current mirror includes transistors 11 and 12 with their bases connected together, and their emitters connected through small resistors 13 and 14, respectively, to $V_{cc}$. Transistor 15, connected across transistor 11, is a vertical transistor which provides $\beta$ independence for the base drive of the mirror.

The PNP current mirror is a lateral PNP device, and exhibits very low gain. To compensate for the low gain, the increased parasitic capacitance on the bit lines with rising temperature, and for the increased $\beta$ gain of other transistors with rising temperature, a temperature compensated current sink is coupled to the PNP current mirror. The temperature compensated current sink draws increasing current at lower temperatures, and tracks the current from the current mirror in constant to slightly negative fashion. The output of transistor 11 is connected through line 16 to the collector of transistor 17. The base of transistor 17 is connected through resistor 18 to $V_{cc}$, and also through the base-emitter circuit of transistor 19 to ground. The base of transistor 19 is connected to the emitter of transistor 17, and also through resistor 21 to ground. A current mirror comprising transistors 22 and 26 may be connected through resistor 24 to a fixed voltage reference, and to ground depending upon the desired tracking rate. The output of the optional current mirror is also connected to the base of transistor 19. In a preferred embodiment transistors 22 and 26 are not employed because the negative tracking coefficient of transistors 17 and 19 is sufficient to achieve the desired rates without the addition of the positive coefficient.

The current through line 16 is mirrored through the collector of transistor 17, and is equal to $V_{be}$ of transistor 19 divided by the resistance of resistor 21. As temperature increases the $V_{be}$ of transistor 19 will diminish, the resistance of resistor 21 will increase, and the current sinking through line 16 will diminish. With decreasing temperature, the $V_{be}$ value increases, the resistance decreases, and the current through line 16 will increase. The net effect of this portion of the circuit is to provide a current sink with a large negative temperature coefficient which compensates for the PNP current mirror $\beta$ variations over temperature.

The current through resistor 24 is controlled by the voltage reference source, and is mirrored through the collector of transistor 26. As temperature increases the $V_{be}$ of transistor 26 decreases, causing a larger voltage drop across resistor 24 and drawing an increased current therethrough. Thus, this portion of the circuit provides a current sink with a positive temperature coefficient. This positive coefficient is slightly lower in absolute value than the negative temperature coefficient of transistors 17 and 19, resulting in a slightly negative tracking rate of the current sink network with respect to temperature. This characteristic offsets the positive $\beta$ temperature characteristic of transistor 15, which provides the base drive of the PNP current mirror, and thus maintains a constant current from the PNP mirror.

One embodiment of the sense amplifier the present invention, shown in FIG. 2, includes a level shifter stage, a driver stage, and a current sinking compensation stage. The level shifter includes a line 31 connected from node 10 to the base of transistor 32 and to the collector of switching transistor 33. Resistor 34 is connected between the emitter of transistor 32 and the base node of transistor 33. Transistor 32 is biased to be maintained in the linear conducting mode at all times, and is provided to establish a high impedance to node 10. When node 10 rises to a predetermined threshold level, transistor 33 will switch into the conducting mode, and will steer substantially all the current from node 10 (i.e., from the PNP current mirror) into the driver section of the sense amplifier.

The threshold level is also temperature compensated to prevent convergence of the low logic level and the threshold level at high temperatures, a common fault in prior art devices. The base node of transistor 33 is connected through line 36 to the compensation stage, which includes a NPN current mirror 37. The mirror 37 is comprised of transistors 38 and 39 connected in typical mirror fashion and driven by a voltage reference connected through resistor 41. As the temperature increases, the value of resistor 41 increases while the $V_{be}$ of transistors 38 and 39 will decrease, creating an offsetting and mutually compensating effect. The current through the mirror 37 will increase, drawing increasing current through resistor 34 and raising the voltage of the base node of transistor 32. As a result, the threshold level will increase with increasing temperature, creating the desired positive threshold compensation.

The driver stage includes a diode 42 which receives the input signal from switching transistor 33 and feeds the signal to the base of transistor 43. Transistor 43 is biased in the conducting mode, and is switched from linear conducting to saturated modes by the incoming signal. A transmission gate consisting of transistor 44 and resistor 46 connected to $V_{cc}$ receives the amplified sense current output of transistor 43 and supplies it to an output buffer stage. The output buffer stage may comprise any high speed TTL buffer configuration known in the prior art, and is not an independent part of the present invention.

A significant feature of the driver stage is the provision of a feedback loop, including diode 47 connected through the base-emitter circuit of transistor 48 to the emitter node of transistor 33. The collector of transistor 48 is connected directly to $V_{cc}$, while the base is connected to $V_{cc}$ through resistor 49. The feedback loop provides negative feedback to the driver stage, holds transistor 51 out of saturation, and the base emitter junction of transistor 33 slightly off when node 10 goes "low."

In the "on" state (sense node high), transistors 32 and 33 are conducting linearly, transistor 43 is saturated, and transistor 48 is off. In the "off" state (sense node low), transistors 32, 43 and 48 are conducting in the linear mode, and transistor 33 is biased off. Thus, only transistors 33 and 43 are switching, and only transistor 33 is switching fully from conducting to non-conducting. Thus, voltage swings in the amplifier stage are minimized, as are parasitic capacitance effects. The transmission gate comprised of transistor 44 and resistor 46 is provided to isolate the feedback loop from the diode stack of a typical output buffer stage, which would otherwise limit the feedback effect. The transmission gate also provides some temperature compensation, because the collector voltages of transistors 43 and 44 tend to fall with rising temperature compensating for the negative tracking of the typical output buffer.

Transistor 51 of the compensation stage has its base coupled to the base of transistor 38, and is connected between the base node of transistor 43 and ground. The current through transistor 51 will increase with rising temperature, and will tend to compensate for the positive temperature coefficient of the $\beta$ gain of transistor 43. Thus, the circuit provides a multiplicity of temperature compensating features to establish thorough control of the sense amplifier network, and to assure a constant noise margin over the operating temperature range.

Because the feedback loop of the driver stage is substantially undamped, it may be subject to oscillation. Indeed, when the signal from node 10 falls very quickly, the presence of the low impedance source, transistor 48, may cause undesirable ringing in the feedback loop. To prevent this effect, the sense amplifier network may be modified as shown in FIG. 3. The circuit components having the same reference numerals as in FIG. 2, with the addition of a prime (') character, provide substantially the same functions as their counterparts described in conjunction with FIG. 2.

A significant feature of the embodiment of FIG. 3 is that the positions of the compensating resistor 34 and the diode 42 are interchanged, so that resistor 34a is connected in the feedback loop of the driver transistor 43', and the diode 42a is connected between the emitter of transistor 32' and the base of transistor 33'. The positive temperature coefficient of the resistor 34a provides the same temperature compensation for the threshold level as in the previous embodiment. In addition, the resistor 34a provides damping in the feedback loop to attenuate any oscillation in the driver stage. As a result, the voltage variations of transistors 43' and 33' are reduced, thereby reducing the rise time and increasing the speed of the device.

In addition, the base node of transistor 33' is not connected to the compensation stage, but rather ballast resistor 52 to ground. Also, the compensation stage comprises a single current mirror consisting of transistors 38' and 39', connected directly to the base node of the driver transistor 43'. The current mirror provides the temperature compensation for the β gain temperature of transistor 43', as well as threshold compensation in conjunction with resistor 34a. A significant advantage of the embodiment of FIG. 3 is that the transistor count is reduced.

It should be noted that the resistors 21 (FIG. 1) and resistors 34 or 34a (FIGS. 2 and 3, respectively) may be trimmed to select the current densities through the transistors, and to alter the temperature tracking rates of the overall network for optimized performance of the device. This provides a substantial practical advantage in manufacturing the sense amplifier of the present invention.

The preferred embodiment of the sense amplifier of my invention, as employed in 64K programmable read only memories, is depicted in FIG. 4. The circuit shown in FIG. 4 operates in substantially the same manner as the circuit shown in FIG. 2. By removing diode 42 from the circuit shown in FIG. 2, however, the overall tracking rate of the sense amplifier is reduced. Furthermore, the addition of resistor 34a also reduces the overall tracking in the same manner as resistor 34.

Although several embodiments of the invention have been shown and described to illustrate particular features of the invention, these are intended for descriptive purposes only. The scope and spirit of the invention may be ascertained from the appended claims.

I claim:

1. A sense amplifier for detecting and amplifying a varying voltage signal indicative of high and low logic level shifts at a sense node, comprising:
    level shifting means, connected to the sense node, for establishing an input voltage threshold level corresponding to the high logic level and a high impedance at voltages below said voltage threshold level;
    a transistor amplifier connected to said level shifting means, the level shifting means switching to form a current path from said sense node to the transistor amplifier for any signal portion above the voltage threshold level; and
    temperature compensation means, connected to the transistor amplifier along a first path in order to compensate for the positive B gain temperature characteristic of said transistor amplifier and the level shifting means along a second path for maintaining a substantially constant voltage difference between the voltage threshold level and the low logic level.

2. the sense amplifier according to claim 1 wherein the temperature compensation means includes a current mirror driven by a constant voltage reference source.

3. The sense amplifier according to claim 1 wherein the level shifting means includes an input transistor having a control electrode coupled to said sense node and further comprising a resistor having a positive temperature coefficient coupled between a first electrode of said input transistor and said temperature compensation means, the current flowing through the resistor increasing with rising temperature and increasing the voltage threshold level with rising temperature.

4. The sense amplifier according to claim 1, wherein the transistor amplifier includes feedback loop means for producing a negative feedback characteristic to counteract any positive temperature effects in the gain of the transistor amplifier.

5. The sense amplifier according to claim 4, further including transmission gate means, connected between the output node of the transistor amplifier and a load, for isolating the feedback loop means from the load.

6. The sense amplifier according to claim 4, wherein the feedback loop means includes a resistance means for attenuating oscillations in said feedback loop and for providing temperature compensation for the β gain characteristic of the transistor amplifier.

7. The sense amplifier according to claim 1, wherein the transistor amplifier includes a driver transistor biased to switch between a linearly conducting mode and a saturated condition.

8. The sense amplifier according to claim 1, further including a controlled current source connected to the sense node, the level shifting means switching above the threshold level to direct the controlled current into the transistor amplifier.

9. The sense amplifier according to claim 8, wherein the controlled current source includes a PNP current mirror having an output connected to the sense node.

10. The sense amplifier according to claim 9, further including current sinking means, the PNP current mirror having a positive β gain temperature characteristic, and the current sinking means being connected to the PNP current mirror to compensate for the positive temperature characteristic of said current mirror.

11. The sense amplifier according to claim 10, wherein the current sinking means includes a first stage having a negative temperature coefficient, the first stage being connected to the current mirror to draw increasing current therefrom with rising temperature and offset the positive temperature characteristic of the output of the current mirror.

12. The sense amplifier according to claim 11, wherein the current sinking means includes a second stage having a positive temperature coefficient, the second stage being connected to the first stage to attenuate the negative temperature characteristic of the first stage.

13. In a sense amplifier having a driver transistor with an output electrode coupled to an output node and a second electrode coupled to a first voltage reference and an input transistor with a first electrode coupled to a voltage supply and a control electrode coupled to a sense node, the improvement comprising:
    a switching transistor having a first electrode coupled to said control electrode of said input transistor, a second electrode coupled to a control electrode of said driver transistor and a control electrode coupled to a second electrode of said input transistor; and
    a temperature compensation circuit having a first transistor with a first electrode coupled to said control electrode of said switching transistor with a first electrode and a second transistor coupled to said control electrode of said driver transistor, said first and second transistors having second electrodes coupled to a second voltage reference and control electrodes coupled to a third voltage source such that said first and second transistors being connected to conduct more current with increasing temperature.

14. The apparatus of claim 13 further comprising a resistance coupled between said second electrode of said input transistor and said control electrode of said switching transistor.

15. The apparatus of claim 13 further comprising:
   a current source coupled to said sense node; and
   a second temperature compensation circuit coupled to said current source and having a first circuit portion with a positive temperature coefficient and a second circuit portion with a negative temperature coefficient.

16. The apparatus of claim 15 wherein said current source includes first and second PNP transistors with bases coupled together, emitters coupled to said voltage supply, a collector of said first PNP transistor being coupled to said sense node, said second circuit portion of said second temperature compensation circuit including first and second negative temperature coefficient transistors, said first negative temperature coefficient transistor having a first electrode coupled to a collector of said second PNP transistor, a second electrode coupled to a control electrode of said second negative temperature coefficient transistor, and a control electrode coupled to a first electrode of said second negative temperature coefficient transistor, said first circuit portion of said second temperature compensation circuit including first and second positive temperature coefficient transistors having control electrodes coupled together and a first electrode of said first positive temperature coefficient transistor coupled to said second electrode of said first negative temperature coefficient transistor.

17. The apparatus of claim 13 further comprising a Schottky diode having an anode coupled to said second electrode of said switching transistor and a cathode coupled to said control electrode of said driver transistor.

18. The apparatus of claim 13 wherein said temperature compensation circuit further includes a third transistor having a control electrode coupled to said control electrodes of said first and second transistors, a first electrode coupled to said second voltage reference and a third electrode coupled to said second voltage reference.

19. The apparatus of claim 13 further comprising a feedback transistor having a control electrode coupled to said output electrode of said driver transistor, and a first electrode coupled to said second electrode of said switching transistor and a second electrode coupled to said first voltage reference.

20. A sense amplifier for detecting and amplifying a varying voltage signal indicative of high and low logic levels at a sense node, comprising:
   an input transistor having a control electrode coupled to said sense node;
   a switching transistor having a first electrode coupled to said sense node;
   a resistance coupled between a first electrode of said input transistor and a control electrode of said switching transistor;
   a driver transistor having a control electrode coupled to a second electrode of said switching transistor, said driven transistor having an output electrode coupled to an output node and a second electrode coupled to a first voltage reference;
   a first temperature compensation circuit having first and second transistors with first electrodes coupled to said control electrodes of said switching and driver transistors, respectively, said first and second transistors having second electrodes coupled to a second voltage references and control electrodes coupled to a third voltage source;
   a current source coupled to said sense node; and
   a second temperature compensation circuit coupled to said current source having a first stage with a positive temperature coefficient and a second stage with a negative temperature coefficient.

* * * * *